United States Patent [19]

Shimane

[11] Patent Number: 5,028,200
[45] Date of Patent: Jul. 2, 1991

[54] WAFER POSITIONING MECHANISM USING A NOTCH FORMED ON THE WAFER PERIPHERY

[75] Inventor: Kazuo Shimane, Kawasaki, Japan

[73] Assignee: Fujitsu Limited, Kawasaki, Japan

[21] Appl. No.: 452,589

[22] Filed: Dec. 19, 1989

[30] Foreign Application Priority Data

Dec. 29, 1988 [JP] Japan ............................... 63-331141

[51] Int. Cl.[5] ............................................. B65G 47/24
[52] U.S. Cl. ..................................... 414/757; 198/394; 414/433
[58] Field of Search .................. 414/757, 433; 198/394

[56] References Cited

U.S. PATENT DOCUMENTS

| | | | |
|---|---|---|---|
| 2,609,942 | 9/1952 | Kofoid .................. | 414/433 |
| 3,820,647 | 6/1974 | Waugh, Jr. et al. ............. | 414/757 X |
| 4,311,427 | 1/1982 | Coad et al. ..................... | 198/394 X |
| 4,441,853 | 4/1984 | Kosugi ............................ | 414/757 |
| 4,662,811 | 5/1987 | Hayden ......................... | 414/757 X |
| 4,813,840 | 3/1989 | Prubhakar et al. ............. | 414/757 X |
| 4,887,904 | 12/1989 | Nakazato et al. ............... | 414/757 X |
| 4,892,455 | 1/1990 | Hine ............................... | 414/757 X |

FOREIGN PATENT DOCUMENTS 446921 11/1974 U.S.S.R. .............................. 198/394

OTHER PUBLICATIONS

"Semiconductor Wafer Alignment Fixture", IBM Technical Disclosure Bulletin, vol. 10, No. 6, Nov. 1967.
"Wafer Chuck Air Flow", IBM Technical Disclosure Bulletin, vol. 18, No. 6, Nov. 1975.

Primary Examiner—David A. Bucci
Attorney, Agent, or Firm—Staas & Halsey

[57] ABSTRACT

A positioning mechanism for wafers put in a container, wherein a notch is formed on the periphery of the wafer. The positioning mechanism includes a drive roller coupled to a drive source, an arm member, a first end thereof being fixed and a second end having a protrusion. The arm is elastically movable in the direction of the wafer surface, and the protrusion has a shape corresponding to the notch of the wafer. A transmission roller is supported between the first and second ends of the arm member. The axes of the drive roller and transmission roller are in the vicinity of the wafer so that the transmission roller is driven by the drive roller while the protrusion contacts with the periphery of the wafer outside the notch region. The transmission roller loses contact with the drive roller when the protrusion is engaged with the wafer notch.

27 Claims, 6 Drawing Sheets

WAFER POSITIONING MECHANISM USING A NOTCH FORMED ON THE WAFER PERIPHERY

BACKGROUND OF THE INVENTION

1. Field of the Invention

The present invention relates generally to a mechanism for positioning semiconductor wafers used for processing wafers and, more particularly, a positioning mechanism for a semiconductor wafer, having a notch on the periphery thereof, for setting the notch position in a predetermined radial direction. In manufacturing semiconductor integrated circuits, especially in wafer processes, semiconductor wafers having a plurality of integrated circuit patterns formed thereon and being processed in order, are required to be positioned in a fixed direction. The positioning mechanism of the present invention is particularly effective in positioning a plurality of wafers put in a wafer carrier in the fixed direction.

2. Description of the Related Art

Generally, it is known to provide a cut off portion formed in a circular semiconductor wafer. The cut off portion has a segmental shape formed by an arc and a chord. The remaining flat side surface of the wafer formed by the cutoff is usually called an "orientation flat" which is formed in a specified direction with regard to an orientation of a semiconductor crystal. The orientation flat is conveniently used for the purpose of positioning wafers, and is formed at an early stage by removing a side portion of a semiconductor ingot parallel to the axis thereof after the cylindrical ingot is grown. The semiconductor wafers with the orientation flat are obtained by cutting the ingot into slices.

Wafers are usually carried or handled in a container, (in other words, a "carrier" of semiconductor wafers) during wafer process, or before and after the specific wafer process in which each wafer is processed one by one. Therefore, it is important to position or to realign plural wafers in the carrier in a fixed direction in order to make the wafer process progress efficiently.

In lithography or test processes of semiconductor wafers, in which each wafer is processed individually, the orientation flat is generally utilized as a reference plane in positioning the wafer precisely at a predetermined position by moving a stage of the apparatus used therefor. To improve work efficiency for these processes, it is necessary to perform a pre-alignment procedure of wafers in the carrier.

In the past, the wafer positioning in the carrier has been performed mechanically using the orientation flat. For a brief explanation, reference is made to FIGS. 1(a) and 1(b). A semiconductor wafer 5 has an orientation flat 9, a straight flat portion thereof having a length ranging between about 30 mm and 50 mm. Generally, the dimensions are standardized, depending on wafer size. The wafer 5 is contained in the carrier and supported vertically and rotatably. For positioning the wafer 5, it is mounted on a drive roller 2, which is rotated by a drive mechanism (not shown). When the circular periphery of the wafer 5 is mounted on the roller 2, a small gap is formed between a wafer guide 11 and the wafer periphery. Thus, the wafer 5 easily rotates in a direction shown by the directional arrow. When the orientation flat 9 rotates to the bottom position, the wafer seats on the wafer guide 11 and stops rotating. When a carrier containing a plurality of wafers and having sufficient length is positioned on the drive roller 2 and the drive roller 2 is rotated, all wafers are positioned at one time by the single drive mechanism.

The above method has a problem in that the accuracy of alignment is not good; therefore, an improvement is disclosed in Japanese Unexamined Patent Publication "SHO-62-219535" opened on Sept. 26, 1987 by T. Ohno.

Figure 1A:
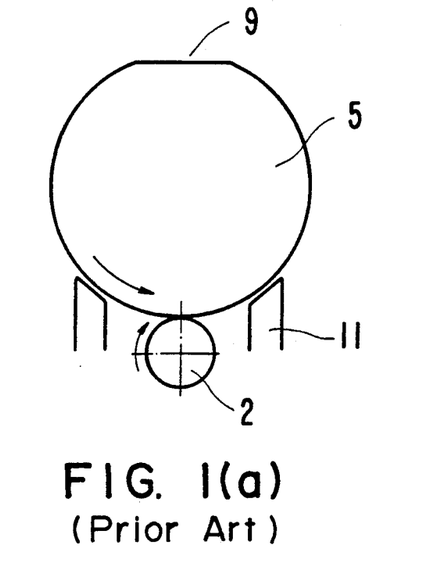
FIGS. 1(a) and 1(b) are schematic views of one of the known positioning methods utilizing an orientation flat of the wafer.
Figure 1B:
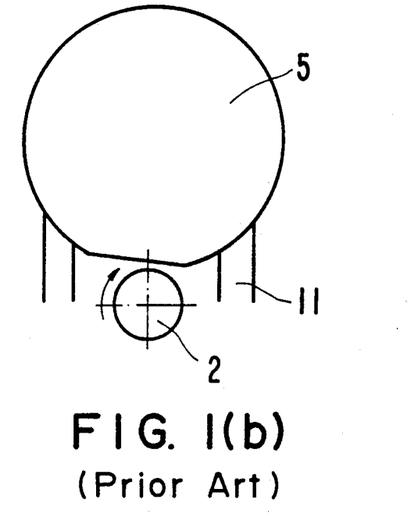

In recent years, there has been a trend to use a wafer configuration having a notch instead of an orientation flat. The notched wafer is more economical because a larger area is available for forming integrated circuit chips than the case for wafers with the orientation flat. Moreover, the orientation flat has a negative influence on uniformity in processing wafers. However, the notched area is so small compared with the cut off portion of the orientation flat that the simple positioning mechanism such as shown in FIGS. 1(a) and 1(b) can not be used for notched wafers.

SUMMARY OF THE INVENTION

A general object of the present invention is therefore, to provide a positioning mechanism for notched wafers, capable of setting the notch position thereof at a predetermined position.

A more specific object of the present invention is to provide a positioning mechanism for notched wafers, which has a relatively simple mechanical structure.

Another object of the present invention is to provide a positioning mechanism for a notched wafer, which accomplishes the positioning function within a short time, corresponding to a single rotation of the wafer.

Still another object of the present invention is to provide a positioning mechanism for positioning a plurality of notched wafers which are placed in a wafer carrier.

The foregoing and related objects are accomplished by the positioning mechanism of the present invention, in which wafers are put in a container, each wafer having a notch on the periphery thereof. The positioning mechanism includes a drive roller having a center axis vertical to the wafer surface and coupled to a drive source, an arm member, a first end thereof being fixed and a second end having a protrusion and elastically movable in the direction of said wafer surface, the protrusion having a shape corresponding to the notch of the wafer, and a transmission roller supported between the first and second ends of the arm member, the center axis of the transmission roller being vertical relative to the wafer surface and mounted on the drive roller, and means for holding the axes of the drive roller and transmission roller in proximity to the wafer so that the transmission roller is driven by the drive roller while the protrusion contacts with the periphery of the wafer outside the notch region, wherein the transmission roller loses contact with the drive roller when said protrusion is engaged with the wafer notch.

The positioning mechanism of the present invention can be applied for positioning an arbitrarily selected number of wafers at one time. Because each wafer is positioned individually by the separated arm member having the transmission roller, a plurality of wafers can be positioned at one time by providing a combined structure of the plurality of individual arm members, each having the transmission roller, and a single drive roller which has an axial length sufficient to drive the plurality of transmission rollers.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 2:
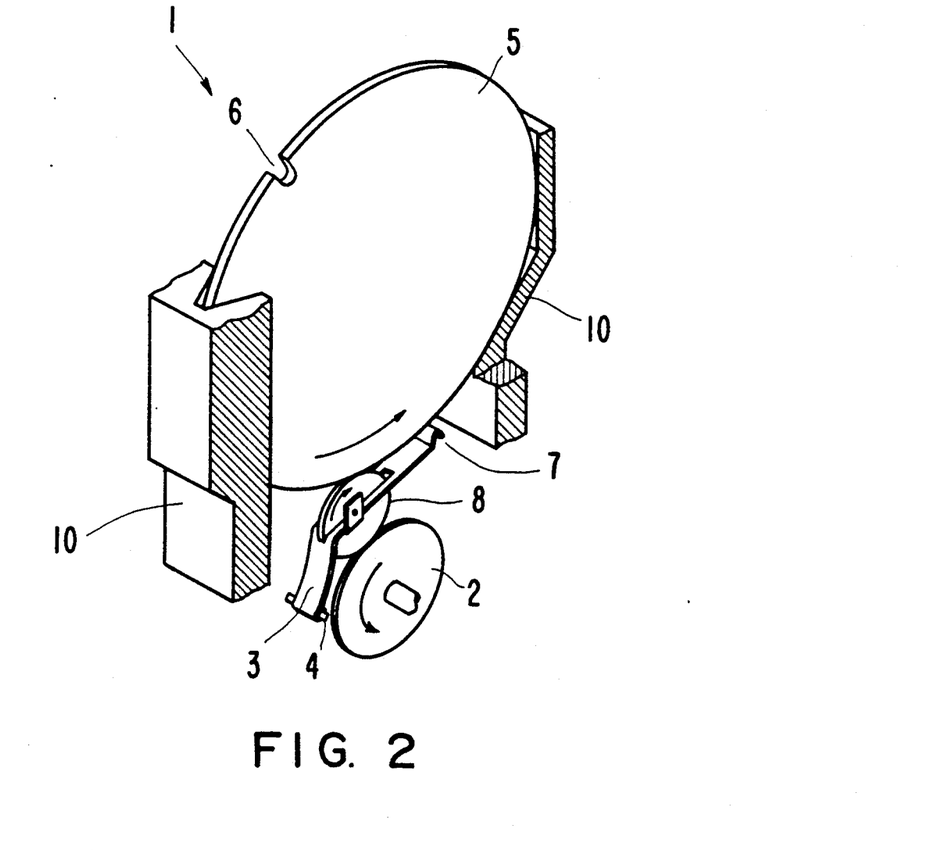
FIG. 2 is a partial perspective view of a first, preferred embodiment of the present invention.
Figure 3:
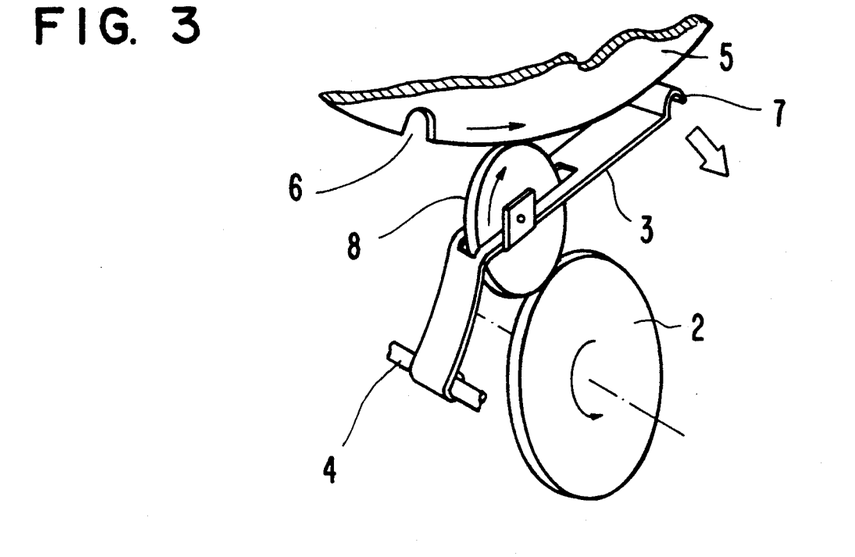
FIG. 3 is an enlarged perspective view of the principal portion of the FIG. 2 embodiment when the wafer is rotatably sliding on the protrusion of arm member.
Figure 4:
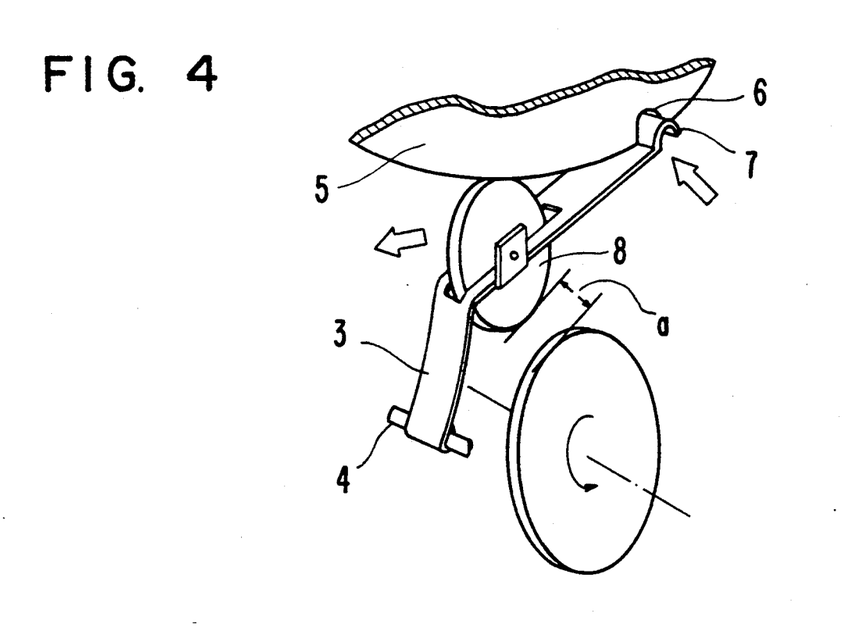
FIG. 4 is an enlarged perspective view of the principal portion of the first embodiment when the notch is engaged with the protrusion, thus separating the transmission roller.
Figure 6:
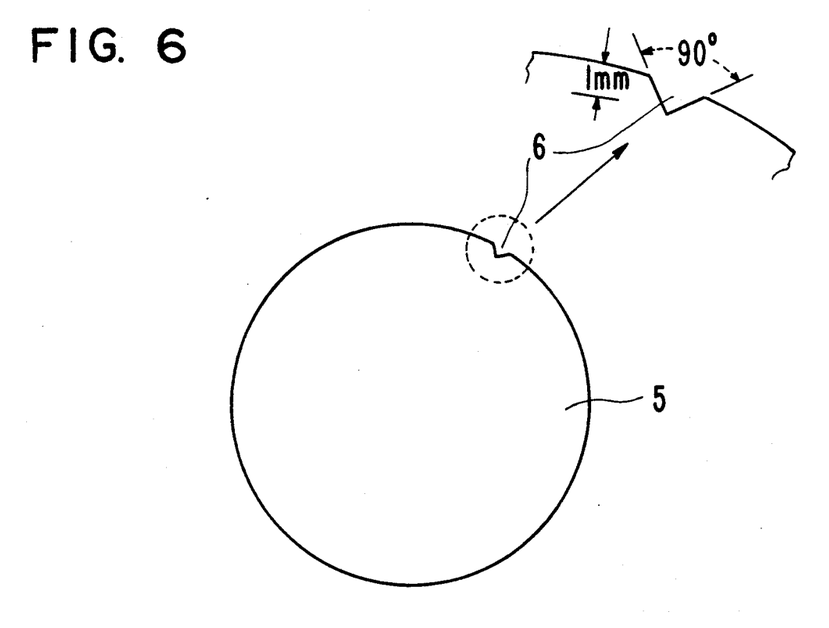
FIG. 6 is a detailed view showing a preferred shape of the notch formed on the wafer.

FIGS. 2 through 4 are perspective views of a first embodiment of the present invention. In FIG. 2, a semiconductor wafer 5 is loaded in a carrier 10, which is partly shown in cross-section holding a single wafer for the sake of clarity. The wafer is thus supported vertically and a notch 6 is formed on the periphery of the wafer 5. The notch 6 has a substantially V-shape of an aperture angle of about 90° and a depth of about 1 mm from the circular periphery as shown in FIG. 6. An arm member 3 having an elastic or resilient quality, is provided under the wafer 5. A transmission roller 8 is rotatably supported by the arm member 3 and a drive roller 2 is disposed under the wafer 5 and transmission roller 8. One end of the arm member 3 is fixed by fixing means, such as a rod 4. The opposite end thereof extends toward the wafer and is provided with a protrusion 7. The outward shape of the protrusion 7 is chosen such that it can fall in the notch 6 when the notch aligns with the protrusion 7.

FIG. 3 is an enlarged perspective view of the positioning mechanism while the protrusion 7 is sliding over the periphery of the wafer 5 outside of the notch 6. FIG. 4 is a similar view when the protrusion 7 aligns with and falls into the notch 6. As shown in FIG. 3, when the protrusion 7 is pressed in a downward direction shown by a directional arrow (holding means of the carrier and the positioning mechanism is explained later) by the peripheral edge of the wafer, the arm member 3, which is formed in a U-shape, is further deformed and the transmission roller 8 is pressed on the drive roller 2 and rotates, resulting in rotating the wafer 5. As shown in FIG. 4, when the protrusion 7 engages with the notch 6 by a restoring force of the arm member 3, the contact of the transmission roller 8 with the drive roller 2 is released and a gap "a" is formed with a result of stopping both rotations of the transmission roller 8 and wafer 5. Thus, the protrusion acts as a detent for moving the transmission roller 8 between first and second positions.

Therefore, regardless of the initial notch position of the wafer, the notch position is brought to a predetermined specified position within one rotation of the wafer.

In the embodiment shown in FIGS. 2 through 4, the drive roller of the positioning mechanism 1 has a diameter of about 36 mm, and is made of a metal roller coated with an outer surface provided with a frictional material, such as silicone rubber and urethane rubber, or other suitable material. The arm member 3 is fabricated of a stainless steel sheet having a thickness of about 0.2 mm and a width of 4 mm, and is pre-formed in a kinked or V-shape. The protrusion 7 is formed by bending one end of the arm member 3, and has a V-shape in cross-section. The shape of the protrusion is selected to engage gently within the notch 6 formed on the periphery of the wafer 5. Therefore, while the periphery of the wafer 5 rotates and slides over the protrusion 7, eventually the protrusion 7 aligns with and engages the notch 6. At this time, the transmission roller 8 is separated from the drive roller 2, and the wafer 5 stops rotating.

The transmission roller 8 of this embodiment is set in an opening and rotatably supported at the middle portion of the arm member 3. It has a diameter of about 20 mm and is made of, for example, polyacetal in order to avoid contamination to the wafer 5. The transmission roller 8 may be supported by a cantilever axis fixed on one side of the arm member 3.

Figure 10:
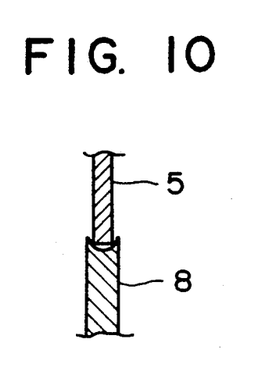
FIG. 10 is an enlarged, sectional view showing a U-shaped surface of the transmission roller.

As shown in FIG. 10, a U-shaped groove having a width of 1 mm and a depth of 1 mm is preferably formed on a cylindrical surface of the transmission roller 8 such that the peripheral edge of the wafer 5 fits in the groove so that the wafer does not run off from the transmission roller. On the other hand, the fixing means of the embodiment utilizes a stainless steel rod 4, 3 mm in diameter, to which the arm member 3 is fixed.

When a plurality of positioning mechanisms 1, as shown in FIGS. 2 through 4, are connected and integrated in an axial direction, a plurality of wafers are positioned at one time even when the wafers 5 are put in the carrier irregularly with regard to the notch position. Each wafer stops rotating at a time when the protrusion 7 formed on each arm member 3 engages with the notch 6 of each corresponding wafer. At least within a time of one wafer rotation, all wafers are positioned in a manner that the notch positions are aligned in an axial direction.

Figure 7:
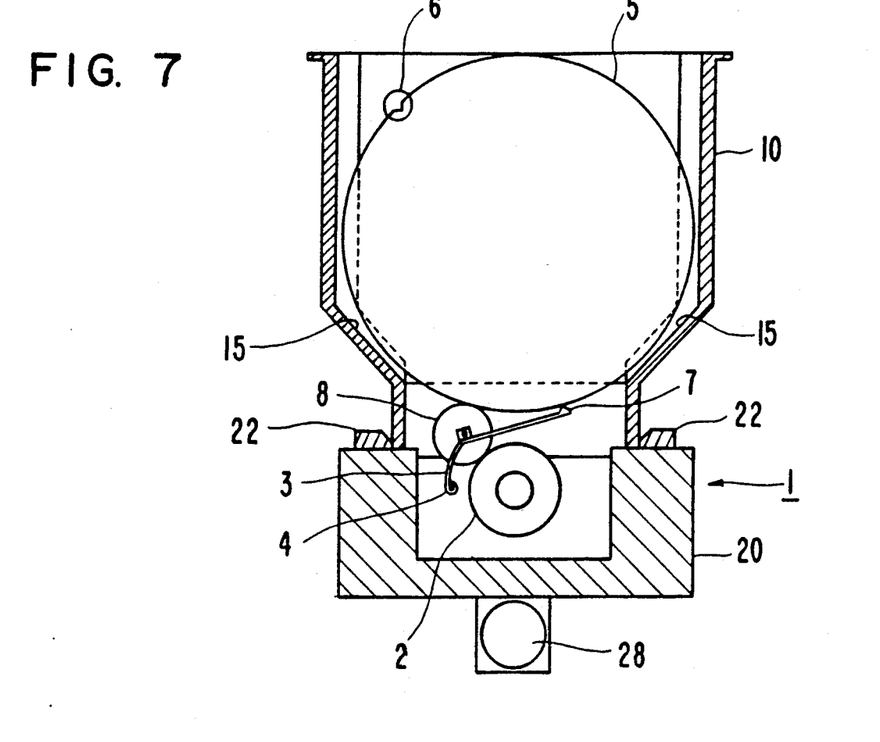
FIG. 7 is a cross-sectional view of an embodiment in which a carrier containing wafers is disposed on the positioning mechanism of the present invention.
Figure 8:
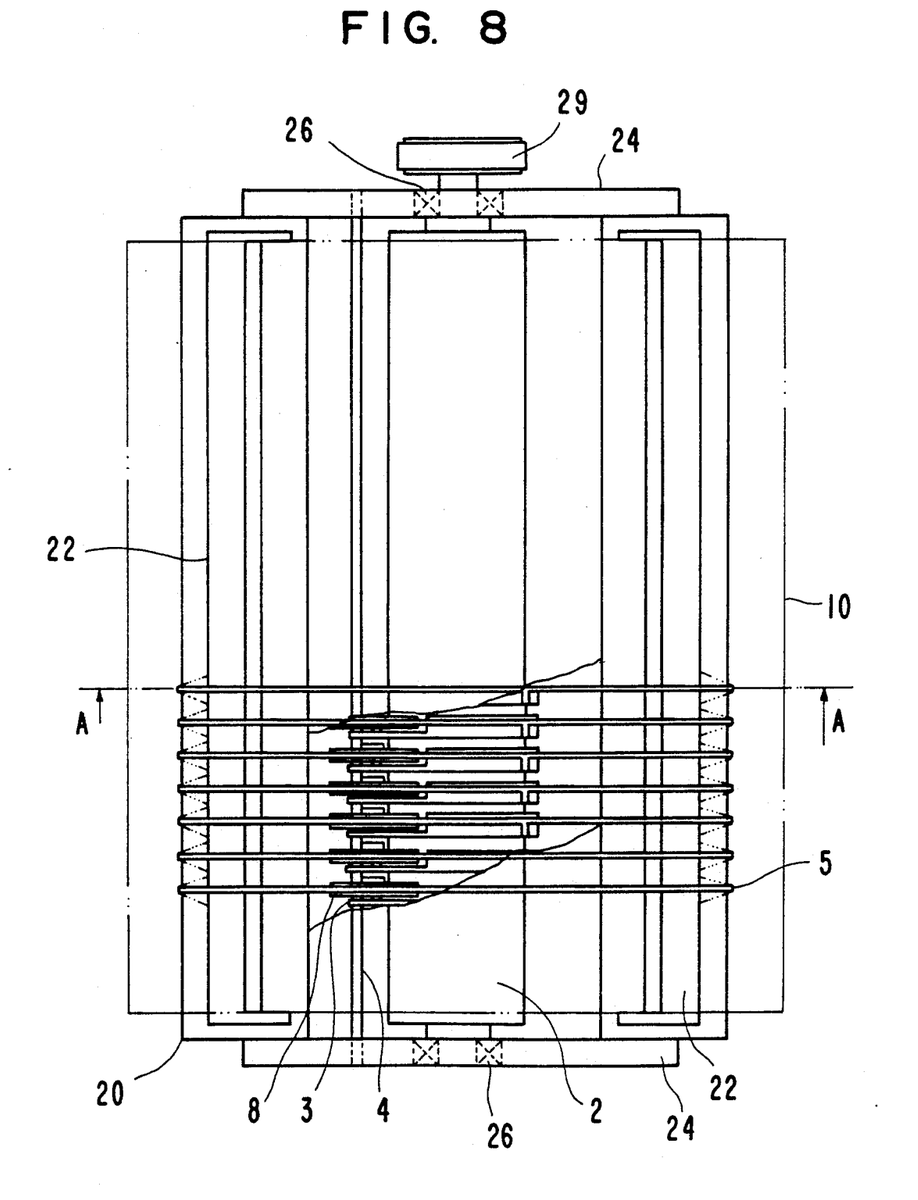
FIG. 8 is a top view, with portions cut away, of an embodiment of the present invention in which the carrier is disposed on the positioning mechanism.

FIG. 2 shows a partial view of the first, preferred embodiment. The actual view of the positioning mechanism of the invention for positioning a plurality of semiconductor wafers put in the carrier is shown in FIGS. 7 and 8. FIG. 7 shows a crosssection along line A—A of FIG. 8 when the carrier 10 containing a plurality of wafers 5 is disposed on the positioning mechanism 1 of the invention. FIG. 8 shows a top view thereof; however, for the sake of clarity, only the outline of the carrier 10 is shown by broken lines, and wafers 5, arm member 3 and transmission rollers 8 are partially shown. It can be seen that semiconductor wafers are arranged in the carrier 10 having a small regular interval of about 5 to 6 mm between adjacent wafers.

The carrier 10 is preferably made of polypropylene, and the wafers 5 are usually supported on sloped side walls 15, as shown in FIG. 7. For positioning the wafers, the carrier 10 is disposed on a holder base 20, and a longitudinal direction of the carrier is thereby aligned by carrier guides 22 attached to the holder base 20. The protrusion 7 of the arm member 3 coacting with the peripheral edge of the transmission roller 8 exert a force to raise the wafer. On the other hand, the transmission roller 8 is pressed against the drive roller 2. Therefore, the wafer having dimensions of, for example, 150 mm (6 in.) and 200 mm (8 in.) in diameter and 0.7 mm in thickness, is easily rotated while barely sliding on the side walls 15. FIG. 8 shows that the transmission roller 8 is supported by a cantilever fixed on the arm member 3, and that an axis of the drive roller 2 is supported by the side walls 24 via a bearing 26 and driven by a belt 29 coupled to a motor 28 (shown n FIG. 7).

The fixing means, such as a rod 4, is fixed also to the opposite side walls 24 which form a holding means with the holder base 20. The fixing position is adjusted such that, when the protrusion 7 is depressed downward with the periphery of the wafer, the arm member 3 is bent and the transmission roller 8 is pushed on the driver roller 2. When the protrusion 7 engages with the notch 6, the arm member is lifted up by an elastic or spring force developed by virtue of the bending or flexing of the arm member 3, so that a gap is formed between the transmission roller 8 and the drive roller 2, which stops the rotation of the wafer.

Figure 5:
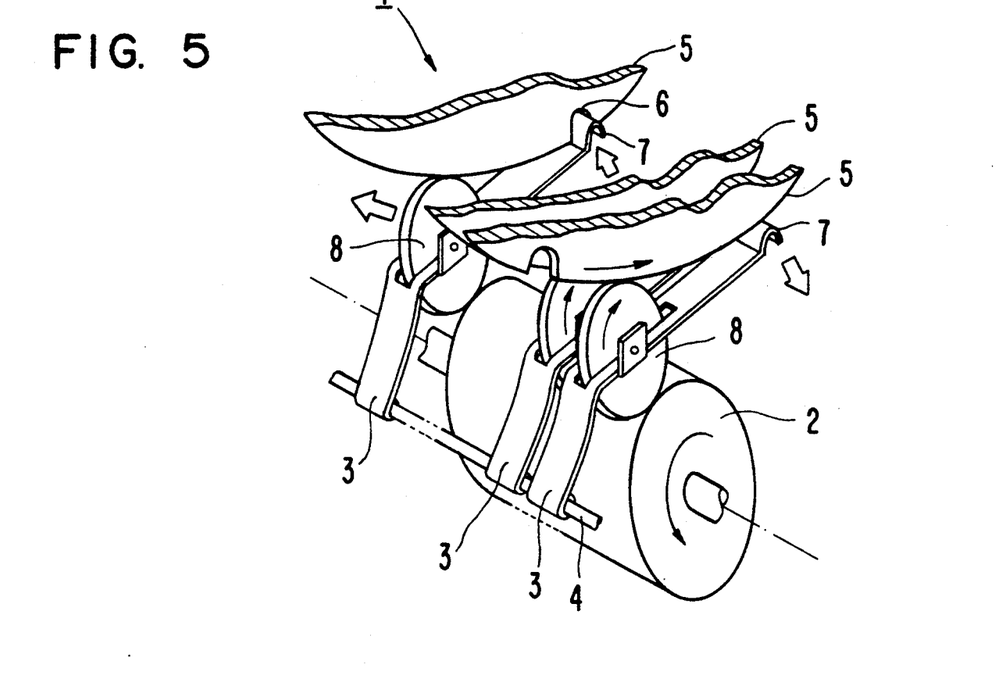
FIG. 5 is a perspective view of another embodiment of the present invention, in which a plurality of arm members are integrated and driven by a single drive roller having sufficient length.

FIG. 5 shows an enlarged perspective view of the detailed structure of a combination of a single drive roller 2 and a plurality of arm members 3, each arm member having a transmission roller 8. Each transmission roller 8 functions to rotate and position a single wafer which is put in the carrier with irregular orientation. In FIG. 5, a drive roller 2 has length sufficient to engage and thus rotate the plurality of transmission rollers 8. Also, a single fixing means or rod 4 has a length sufficient to fixedly support the same number of arm members 3. For example, when a carrier has a capacity of holding 25 wafers at regular intervals of about 5 to 6 mm, both axial lengths of the driver roller 2 and the rod 4 are chosen to be about 130 to 160 mm.

Figures 9, 9A:
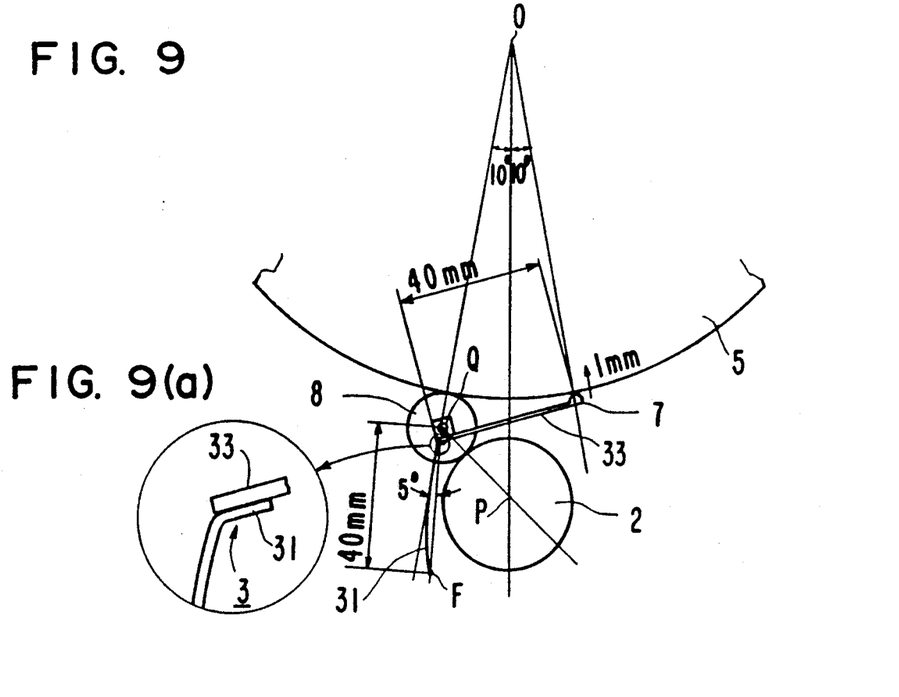
FIG. 9 is a schematic view showing relative arrangements of the wafer, transmission roller, arm member and drive roller according to one of the embodiments.
FIG. 9(a) is an enlarged view of the encircled area of FIG. 9.

Now, an example of the relative arrangements of wafer 5, transmission roller 8, drive roller 2 and arm member 3 is explained using a side view of FIG. 9. In this case, the diameters of wafer 5, transmission roller 8 and drive roller 2 are selected to be 200, 20, and 36 mm, respectively. The arm member 3 is formed by soldering or welding two parts 31 and 33, both having a length of about 40 mm. The first part 31 is made of phosphor bronze or other suitable material having a spring characteristic, and a thickness of about 0.5 mm. The second part 33 is a machined part of steel sheet having a thickness of about 1 mm and exerts substantially no spring action.

The center position Q of the transmission roller 8 is located on a line forming an angle of 10° with a line O-P (herein, O and P designate the centers of the wafer 5 and drive roller 2, respectively). A connecting line between protrusion 7 and the center O also forms an angle of about 10° with line O-P. The arm member 3 is bent and forms a V-shape. The fixing point F of the arm member 3 is determined such that the position F is located on the right side of the extension of line O-Q, forming an angle of about 5° as shown in FIG. 9.

When the above structure is utilized for the positioning mechanism, the transmission roller 8 is separated from the drive roller 2 forming a gap of 0.5 mm at a time the protrusion 7 engages with the notch 6 having a depth of 1 mm.

The positioning mechanism 1 of the preferred embodiment is arranged under the carrier 10 as shown in FIGS. 7 and 8, and the drive roller 2 is rotated at a peripheral speed of the wafer of about 50 mm per second. As a result, a satisfactory result can be obtained for positioning the wafer within a single rotation thereof.

All dimensions, shapes and materials of wafer 5, notch 6, arm member 3, protrusion 7, transmission roller 8, drive roller 2, etc. disclosed in the embodiments are conventional. Thus, it is apparent that other embodiments and modifications of the invention are possible. Further, the number of wafers to be positioned at one time and the rotational speeds of the movable parts are also conventional.

As described above, the wafer positioning mechanism of the present invention utilizing the notch, which is a substitute for the orientation flat used in the past, can handle an increased wafer size, thus achieving a larger yield of chips from a single wafer and a more uniform processed surface of wafers. The positioning mechanism of the invention can be utilized for positioning not only a single wafer but also a plurality of wafers in the carrier at one time.

The present invention has a special feature that wafers put in the carrier during the wafer processes, can be positioned in a short time just before the next process step for pre-alignment purposes, and is useful in improving the wafer processes.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims and therefore, to be embraced therein.

What is claimed is:

1. A positioning mechanism for a wafer put in a container and having a notch formed on a periphery thereof, said positioning mechanism comprising:
    a drive roller having a center axis and an outer surface which is vertically spaced from a peripheral edge of said wafer, and being coupled to a drive source;
    at least one arm member having a first end which is positionally fixed and a second end having a protrusion and being elastically movable in the direction of said wafer, surface the protrusion having a shape corresponding to a shape of the notch of the wafer for fitting therein;
    a transmission roller supported between the first and second ends of said at least one arm member, a center axis thereof being parallel to said peripheral edge of the wafer and having an outer surface engageable with the outer surface of said drive roller; and
    means for holding a combination of said drive roller and said at least one arm member in proximity to said wafer so that said transmission roller is normally driven by said drive roller while said protrusion is contacting with the peripheral edge of the wafer, and not driven when said protrusion is engaged with the wafer notch, whereby said transmission roller loses contact with the drive roller.

2. A positioning mechanism for a wafer as recited in claim 1, further comprising a plurality of arm members and corresponding transmission rollers, said drive roller having an axial length sufficient to engage and thus drive said plurality of the transmission rollers, thereby positioning a plurality of wafers at one time.

3. A positioning mechanism for a wafer as recited in claim 1, wherein said at least one arm member is made of a spring sheet forming a V-shape and is elastically deformed toward the drive roller when said peripheral edge of the wafer is contacting with said transmission roller and said protrusion.

4. A positioning mechanism for a wafer as recited in claim 2, wherein said plurality of arm members is made of a spring sheet forming a V-shape and is elastically deformed toward the drive roller when said peripheral edge of the wafer is contacting with said transmission roller and said protrusion.

5. A positioning mechanism for a wafer as recited in claim 1, wherein said at least one arm member is made of two sheet parts connected with each other at a middle point of the arm member and forming a V-shape, the first part being of spring material and one end thereof forming the first end of the arm member, and wherein the arm member is elastically deformed toward the drive roller when said peripheral edge of the wafer is contacting with said transmission roller and said protrusion.

6. A positioning mechanism for a wafer as recited in claim 2, wherein said plurality of arm members is made of two sheet parts connected with each other at a middle point of the arm member and forming a V-shape, the first part being of spring material and one end thereof forming the first end of the arm member, and wherein the arm member is elastically deformed toward the drive roller when said peripheral edge of the wafer is contacting with said transmission roller and said protrusion.

7. A positioning mechanism for a wafer as recited in claim 3, wherein a slot is formed in said arm member, and said transmission roller is rotatably mounting in the slot supported on a surrounding portion of the arm.

8. A positioning mechanism for a wafer as recited in claim 5, wherein said transmission roller is supported in a middle portion of the arm member.

9. A positioning mechanism for a wafer as recited in claim 6, wherein said transmission roller is supported in a middle portion of the arm member.

10. A positioning mechanism for a wafer as recited in claim 1, wherein said container is a carrier of semiconductor wafers for holding the wafers at regular intervals and has an opening at the bottom portion thereof exposing a substantial bottom portion of the peripheral edge of the wafer contained therein, and wherein said holding means comprises a holder base and a carrier guide, the holder base supporting said combination of the drive roller and the at least one arm member at positions selected to effectuate movement of the transmission roller away from the driver roller when the notch receives the protrusion.

11. A positioning mechanism for a wafer as recited in claim 2, wherein said container is a carrier of semiconductor wafers for holding the waters at regular intervals and has an opening at the bottom portion exposing a substantial bottom portion of the peripheral edge of the wafers contained therein, and wherein said holding means comprises a holder base and a carrier guide, the holder base supporting said combination of the drive roller and the plurality of arm member at positions selected to effectuate movement of transmission roller away from the drive roller when the notch receives the protrusion.

12. A positioning mechanism of a wafer as recited in claim 1, wherein said transmission roller has a groove formed on a cylindrical surface thereof, the width of the groove being greater than a thickness of the wafer.

13. A positioning mechanism of a wafer as recited in claim 2, wherein said transmission roller has a groove formed on a cylindrical surface thereof, the width of the groove being greater than a thickness of the wafer.

14. A positioning mechanism of a wafer as recited in claim 1, wherein said at least one arm member is fixed by fixing means to a side wall which is a constituent part of said holding means.

15. A positioning mechanism of a wafer as recited in claim 2, wherein said arm members are fixed by fixing means to a side wall which is a constituent part of said holding means.

16. A positioning mechanism of a wafer as recited in claim 14, wherein said fixing means of the at least one arm member includes a rod.

17. A positioning mechanism of a wafer as recited in claim 15, wherein said fixing means of the arm member includes a rod.

18. A positioning mechanism of a wafer as recited in claim 14, wherein the position of said fixing means, is located away from a line connecting both centers of the wafer and the transmission roller, and toward the drive roller.

19. A positioning mechanism of a wafer as recited in claim 15, wherein the position of said fixing means is located away from a line connecting both centers of the wafer and the transmission roller, and toward the drive roller.

20. An apparatus for positioning a wafer having a notch formed in a peripheral edge thereof, comprising:
a rotatable drive roller having an outer surface spaced from the peripheral edge of the wafer;
a transmission roller having an outer surface engaging the peripheral edge of the wafer;
means for mounting the transmission roller for movement between a first position in which the outer surfaces of
means for mounting the transmission roller surfaces or the drive roller and the transmission rollers engage each other, and a second position in which the outer surfaces are separated from each other; and
detent means, associated with the mounting means for moving the transmission roller from the first position to the second position when engaged with the notch.

21. An apparatus as recited in claim 20, wherein the transmission roller has a U-shaped surface which engages the peripheral edge of the wafer.

22. An apparatus as recited in claim 20, wherein the mounting means comprises an arm having first and second opposite ends, and being mounted by one of the ends adjacent the wafer.

23. An apparatus as recited in claim 22, wherein the arm has first and second segments, one of which is flexible and the other of which is relatively non-flexible, wherein the flexible segment includes the mounting end of the arm.

24. An apparatus as recited in claim 23, wherein the detent means is a protrusion formed on the opposite end of the arm, and is thus formed on the relatively non-flexible segment of the arm.

25. An apparatus for positioning a plurality of wafers, each having a notch formed in a peripheral edge thereof, comprising:
- a rotatable drive roller having an outer surface spaced from the peripheral edges of the wafers;
- a plurality of transmission rollers, each having an outer surface engaging the peripheral edges of correspondingly juxtaposed wafers;
- means for mounting the plurality of transmission rollers for movement between a first position in which the outer surfaces of the drive roller and the plurality of transmission rollers engage each other, and a second position in which the outer surfaces are separated from each other; and
- detent means, associated with the mounting means, for moving the plurality of transmission rollers individually and independent from the first position to the second position when engaged with the notches of corresponding wafers.

26. An apparatus as recited in claim 25, wherein the mounting means comprises a plurality of arms, each corresponding to one of the plurality of transmission rollers which are mounted respectively on each of the arms, each arm having first and second ends, with the first end being fixedly mounted to a stationary supporting structure.

27. An apparatus as recited in recited in claim 26, wherein the detent means comprises a plurality of protrusions, one of which is formed on each of the arms, and being receivable in the notches corresponding wafers when rotated to a position of alignment.

* * * * *